United States Patent [19]

Nagahata et al.

[11] Patent Number: 5,739,837
[45] Date of Patent: Apr. 14, 1998

[54] THERMAL PRINTHEAD, AND CLIP-TYPE TERMINAL LEAD AND COVER MEMBER USED THEREFOR

[75] Inventors: Takaya Nagahata; Tokihiko Kishimoto; Koji Nishi; Masanori Minamino, all of Kyoto, Japan

[73] Assignee: Rohm Co. Ltd., Kyoto, Japan

[21] Appl. No.: 646,276

[22] PCT Filed: Oct. 3, 1995

[86] PCT No.: PCT/JP95/02015

§ 371 Date: May 16, 1996

§ 102(e) Date: May 16, 1996

[87] PCT Pub. No.: WO96/10490

PCT Pub. Date: Apr. 11, 1996

[30] Foreign Application Priority Data

| Oct. 5, 1994 | [JP] | Japan | 6-240985 |
| Dec. 28, 1994 | [JP] | Japan | 6-327320 |
| Jan. 25, 1995 | [JP] | Japan | 7-010000 |
| Mar. 22, 1995 | [JP] | Japan | 7-062541 |
| Oct. 3, 1995 | [JP] | Japan | 6-238946 |

[51] Int. Cl.[6] ................................................. B41J 2/335
[52] U.S. Cl. ................................................. 347/200; 347/205
[58] Field of Search ................................. 347/200, 201, 347/205

[56] References Cited

U.S. PATENT DOCUMENTS

| 4,327,365 | 4/1982 | Noda | 346/76 |
| 4,368,491 | 1/1983 | Saito | 358/283 |

FOREIGN PATENT DOCUMENTS

| 0 501 707 | 9/1992 | European Pat. Off. |
| 57-121543 | 7/1982 | Japan. |
| 61-132356 | 6/1986 | Japan | B41J 3/20 |
| 61-200245 | 12/1986 | Japan | B41J 3/20 |
| 63-179764 | 7/1988 | Japan | B41J 3/20 |
| 64-78859 | 3/1989 | Japan | B41J 3/20 |
| 1-127749 | 8/1989 | Japan | B41J 3/20 |
| 2-95643 | 7/1990 | Japan | B41J 2/345 |
| 2-286261 | 11/1990 | Japan | B41J 2/345 |
| 2-148569 | 12/1990 | Japan | H01R 9/09 |
| 2-292055 | 12/1990 | Japan | B41J 2/335 |
| 3-57656 | 3/1991 | Japan | B41J 2/345 |
| 4-38670 | 3/1992 | Japan | H01R 9/09 |
| 4-50237 | 4/1992 | Japan | B41J 2/335 |
| 4-191057 | 7/1992 | Japan | B41J 2/335 |
| 4-282262 | 10/1992 | Japan | B41J 2/345 |
| 5-208513 | 8/1993 | Japan | B41J 2/345 |

*Primary Examiner*—Huan H. Tran
*Attorney, Agent, or Firm*—Michael D. Bednarek; Kilpatrick Stockton LLP

[57] ABSTRACT

A thermal printhead according to the present invention includes a stepped heat sink plate (1) having an upper first supporting surface (1a) and a lower second supporting surface (1b), a head substrate (2) mounted on the first supporting surface (1a) of the heat sink plate (1) and formed with printing dots (3), and a printed circuit board (14) mounted on the second supporting surface (1b) of the heat sink plate (1) and formed with various wiring patterns. The head substrate (2) has an edge projecting from the first supporting surface (1a) of the heat sink plate (1) toward the second supporting surface (1b). The printed circuit board (14) overlaps the projecting edge of the head substrate (2) with a predetermined spacing (18) therebetween.

13 Claims, 17 Drawing Sheets

5,739,837

THERMAL PRINTHEAD, AND CLIP-TYPE TERMINAL LEAD AND COVER MEMBER USED THEREFOR

TECHNICAL FIELD

The present invention relates to a thermal printhead used for a facsimile machine or the like. The present invention also relates to a clip-type terminal lead and a cover member which are advantageously used for such a thermal printhead.

BACKGROUND ART

Typical thermal printheads are disclosed in Japanese Patent Application Laid-open No. 2-286267 and Japanese Patent Application Laid-open No. 2-292055 for example. The thermal printheads in these documents have a structure wherein a head substrate made of a ceramic and a printed circuit board made of a synthetic resin are juxtaposed in a coplanar manner on a metallic heat sink plate. The head substrate is provided with a heating resistor constituting a line of printing dots, a common electrode, a plurality of individual electrodes and a plurality of drive IC chips. On the other hand, the printed circuit board is formed with a wiring pattern for connecting each of the drive ICs to a connector for external connection.

However, in the thermal printhead having the above structure, since the head substrate and the printed circuit board are juxtaposed in a common plane, the overall widthwise dimension cannot be made smaller than the total of the widthwise dimensions of the head substrate and printed circuit board, so that the size is inevitably made large. Accordingly, the heat sink plate is also made large, resulting in an increase in the total weight.

For solving such a problem, Japanese Patent Application Laid-open No. 3-57656 proposes a thermal printhead wherein a head substrate and a printed circuit board are mounted at different heights on a stepped heat sink plate. More specifically, the heat sink plate has an upper first supporting surface and a lower second supporting surface. The head substrate is attached to the first supporting surface with one longitudinal edge of the substrate projecting, whereas the printed circuit board is attached to the second supporting surface to partially overlap the projecting edge of the head substrate. As a result, the overall widthwise dimension of the thermal printhead can be reduced by the overlapping amount of the head substrate and the printed circuit board.

However, in the thermal printhead having the above-described stepped structure, since the upper surface of the printed circuit board is arranged to come into direct contact with the lower surface of the head substrate, thermal conduction from the head substrate to the heat sink plate is blocked by the printed circuit board disposed therebetween. As a result, the head substrate dissipates less heat to the atmosphere, thereby failing to deal with high-speed printing which generates a large amount of heat.

Further, the direct contact of the head substrate with the printed circuit board allows the thicknesswise thermal expansion in the printed circuit board to directly affect the head substrate, thereby incurring a problem of deteriorating printing quality due to the deformation of the head substrate.

Further, in the thermal printhead having the stepped structure, since electrical connection between the head substrate and the printed circuit board is provided by wire bonding with the use of thin metal wires, it is also a problem that errors frequently occur when performing wire bondings.

DISCLOSURE OF THE INVENTION

An object of the present invention is to provide a thermal printhead which solves the foregoing problems.

Another object of the present invention is to provide a thermal printhead by which the printing performance is hardly deteriorated by a rise in temperature.

Another object of the present invention is to provide a clip-type terminal lead which can be advantageously used for such a thermal printhead.

Still another object of the present invention is to provide a cover member which can be advantageously used for such a thermal printhead.

According to a first aspect of the present invention, there is provided a thermal printhead comprising: a stepped heat sink plate having an upper first supporting surface and a lower second supporting surface; a head substrate mounted on the first supporting surface of the heat sink plate and formed with printing dots; and a printed circuit board mounted on the second supporting surface of the heat sink plate and formed with a wiring pattern; wherein the head substrate has an edge projecting from the first supporting surface of the heat sink plate toward the second supporting surface; and wherein the printed circuit board overlaps the projecting edge of the head substrate with a predetermined spacing therebetween.

Function and advantages of the thermal printhead having the above structure will be specifically described later according to embodiments with reference to the accompanying drawings.

The projecting edge of the head substrate may be provided with a temperature sensing thermistor.

According to a preferred embodiment of the present invention, the head substrate is provided with a plurality of drive ICs for driving the printing dots and the projecting edge of the head substrate is formed with a plurality of connection terminals electrically connected to the drive ICs. The printed circuit board is formed with a plurality of connection electrodes corresponding to the connection terminals on the head substrate wherein each of the connection terminals on the head substrate is electrically connected to a corresponding connection electrode on the printed circuit board via a metallic clip-type terminal lead.

The terminal lead has a clip portion which is held in clipping engagement with the projecting edge of the head substrate and a stem portion which extends from the clip portion toward the printed circuit board.

Preferably, the stem portion of the terminal lead extends obliquely toward the printed circuit board for soldering to the corresponding connection electrode. Advantageously, the stem portion of the terminal lead has a tip surface which inclines at an obtuse angle relative to the printed circuit board.

Preferably, the clip portion of the terminal lead has an engagement piece held in contact with the corresponding connection terminal on the head substrate and both side edges of the engagement piece are offset away from the connection terminal. In such a case, both side edges of the engagement piece of the terminal lead can be offset by chamfering. Alternatively, the engagement piece of the terminal lead may be formed with a contact portion for the corresponding connection terminal so that the contact portion as a whole is convexly curved in transverse section toward the corresponding connection terminal. In this way, the both side ends of the engagement piece are consequently offset.

Advantageously, each connection terminal on the head substrate has a multi-layer structure. In such a case, it is particularly advantageous that each connection terminal is formed to include a lower layer made of gold and a surface layer made of one selected from silver and silver-palladium.

The engagement piece of the clip portion of the terminal lead together with the corresponding connection terminal on the head substrate may be enclosed by an insulating resin.

Preferably, the head substrate is attached generally at a longitudinally central portion thereof to the first supporting surface of the heat sink plate, whereas the printed circuit board is attached generally at a longitudinally central portion thereof to the second supporting surface of the heat sink plate. In such a case, it is particularly advantageous that both ends of the head substrate are connected to both ends of the printed circuit board, respectively, via a plurality of clip-type terminal leads and that the printed circuit board is deformed so that its both ends are closer to the head substrate.

Another preferred embodiment of the present invention, the printed circuit board is covered with a cover member projecting toward the head substrate, wherein the cover member comprises a plurality of engagement legs which are held in snapping engagement with predetermined portions of the printed circuit board and at least one abutment leg which rests on the heat sink plate. Preferably, the cover member further comprises at least one engagement tongue which engages the projecting edge of the head substrate. In such a case, it is particularly advantageous that the abutment leg of the cover member is disposed between each engagement leg and the engagement tongue as well as at a position closer to the engagement tongue when viewed widthwise of the cover member. The cover member may be made of an electrostatically conductive resin.

According to a second aspect of the present invention, there is provided a metallic clip-type terminal lead comprising: a clip portion; and a stem portion projecting from the clip portion; wherein the clip portion has a first engagement piece for electrical conduction and at least one second engagement piece opposite to the first engagement piece; and wherein at least both side edges of the first engagement piece are offset away from the second engagement piece.

The clip-type terminal lead having the above structure can be advantageously used for the thermal printhead having the foregoing stepped structure. However, the terminal lead is not necessarily limited to such an application and can be used for electrically connecting two available circuit boards.

According to a third aspect of the present invention, there is provided a cover member for a circuit board supported on a heat sink plate. The cover member comprises a plurality of engagement legs which are held in snapping engagement with predetermined portions of the circuit board and at least one abutment leg which rests on the heat sink plate. The applications of the cover member having the above structure is not limited to the thermal printhead having the stepped structure.

Other objects, features and advantages of the present invention will become apparent from the following description of the embodiments given with reference to the accompanying drawings.

BEST MODE FOR CARRYING OUT THE INVENTION

Figure 1:
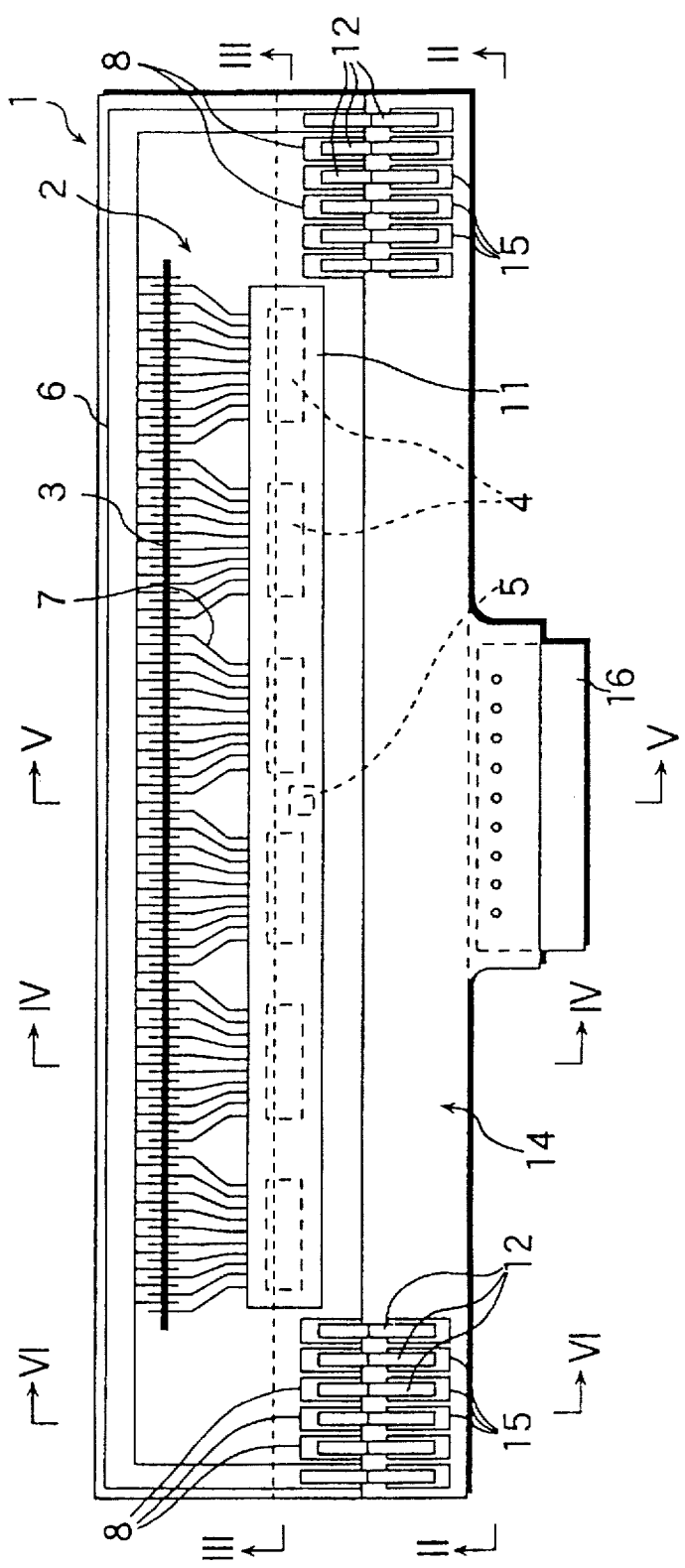
FIG. 1 is a plan view of a thermal printhead according to a first embodiment of the present invention.
Figure 2:
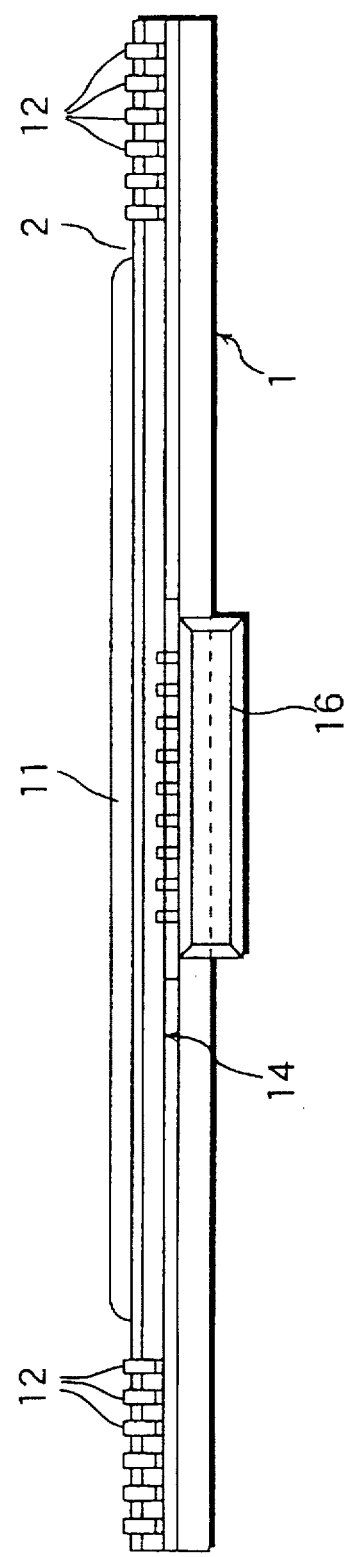
FIG. 2 is a view of the same thermal printhead taken in the direction of the arrows along lines II—II of FIG. 1.
Figure 3:
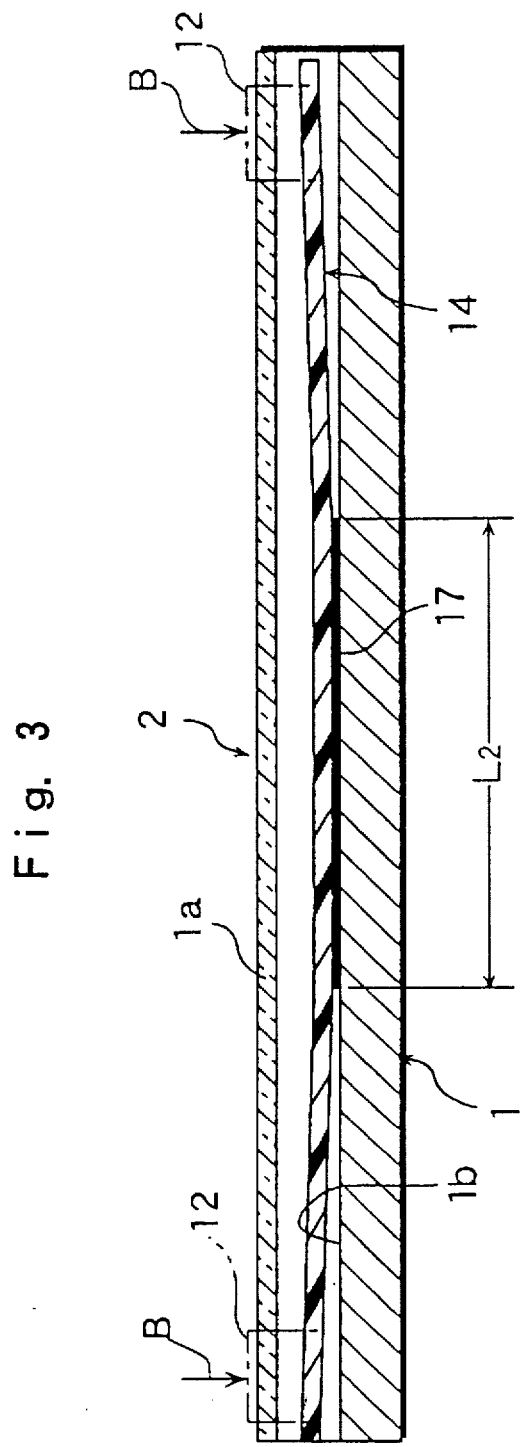
FIG. 3 is a sectional view taken along lines III—III of FIG. 1.

Preferred embodiments of the present invention will be described below with reference to the drawings.

FIGS. 1–8 show a thermal printhead according to a first embodiment of the present invention. The thermal printhead includes a metallic heat sink plate 1 made of aluminum for example. As shown in FIGS. 2–8, the heat sink plate 1 has a stepped upper surface having a higher first supporting surface 1a and a lower second supporting surface 1b. The first supporting surface 1a carries a head substrate 2, whereas the second supporting surface 1b carries a printed circuit board 14. The difference in height between the first supporting surface 1a and the second supporting surface 1b is designated by Reference H in FIG. 4.

The head substrate 2, which has an elongated rectangular configuration, is made of an insulting material such as a ceramic. The head substrate 2 has an upper surface formed with a linear heating resistor 3 extending longitudinally thereof together with an array of plural drive ICs 4 arranged in parallel to the heating resistor 3. A thermistor 5 (see FIGS. 1 and 5) as a temperature sensing device is provided between the two central drive ICs of the drive ICs 4. As shown in FIG. 1, the upper surface of the head substrate 2 is also formed with a common electrode 6 and plural individual electrodes 7 both of which are electrically connected to the heating resistor 3. Further, the upper surface of the head substrate 2 is formed with a wiring pattern WP (partially shown in FIG. 4) connected to each of the drive ICs 4, whereas a plurality of connection terminals 8 are arranged adjacent to both of the shorter edges of the head substrate 2. The connection terminals 8 are electrically connected to the above-mentioned wiring pattern WP. The both ends of the common electrode 6 as well as the connection terminals 8 serve as connection terminals for external electrical connection.

Figure 4:
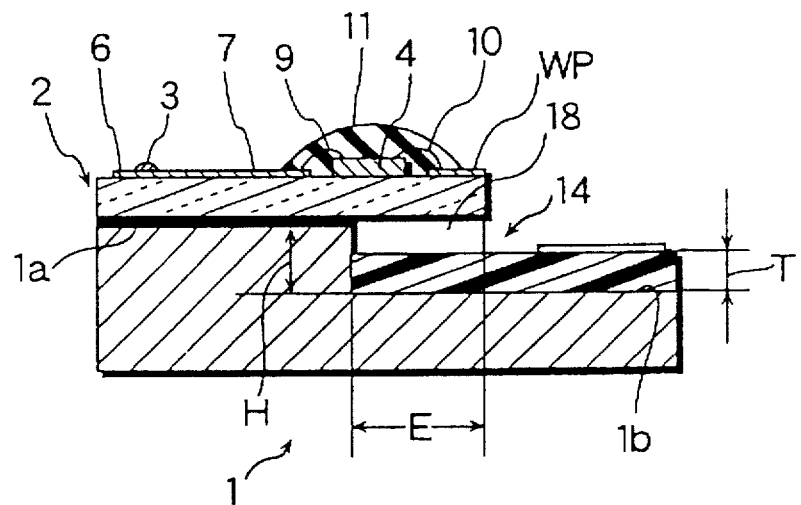
FIG. 4 is a sectional view taken along lines IV—IV of FIG. 1.

As shown in FIG. 4, each of the individual electrodes 7 is wire-bonded via a thin metal wire 9 to one of the drive ICs 4, whereas each of the drive ICs a is wire-bonded via a thin metal wire 10 to the wiring pattern WP. Each of the drive ICs 4, the thermistor 5, and each of the metal wires 9, 10 are covered with a protection coating 11 made of a synthetic resin (see FIGS. 1, 2, 2, and 5).

One of the longitudinal edges of the head substrate 2 is arranged to project by a suitable amount E from the first supporting surface 1a of the heat sink plate 1 toward the second supporting surface 1b (see FIGS. 4–7). Preferably, the projecting amount E is so determined that the drive ICs 4 and the thermistor 5 project from the first supporting surface 1a toward the second supporting surface 1b.

Figure 8:
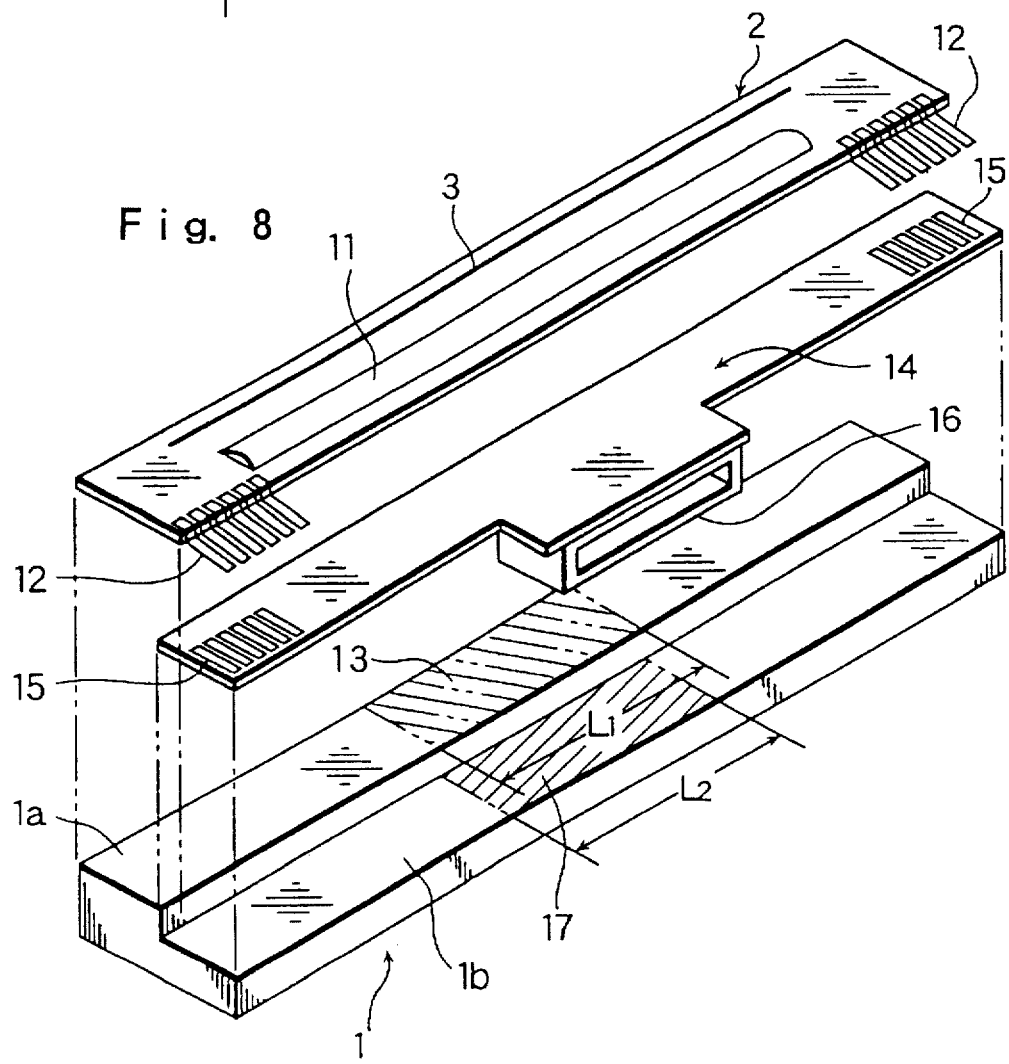
FIG. 8 is an exploded perspective view of the thermal printhead shown in FIG. 1.

As shown in FIG. 8, the head substrate 2 is attached generally at a longitudinally central portion of a length L1 to the first supporting surface 1a of the heat sink plate 1 by an adhesive 13 (an ultraviolet-setting adhesive for example). Alternatively, the whole length of the head substrate 2 may be attached to the heat sink plate 1 by adhesive tape.

Figure 7:
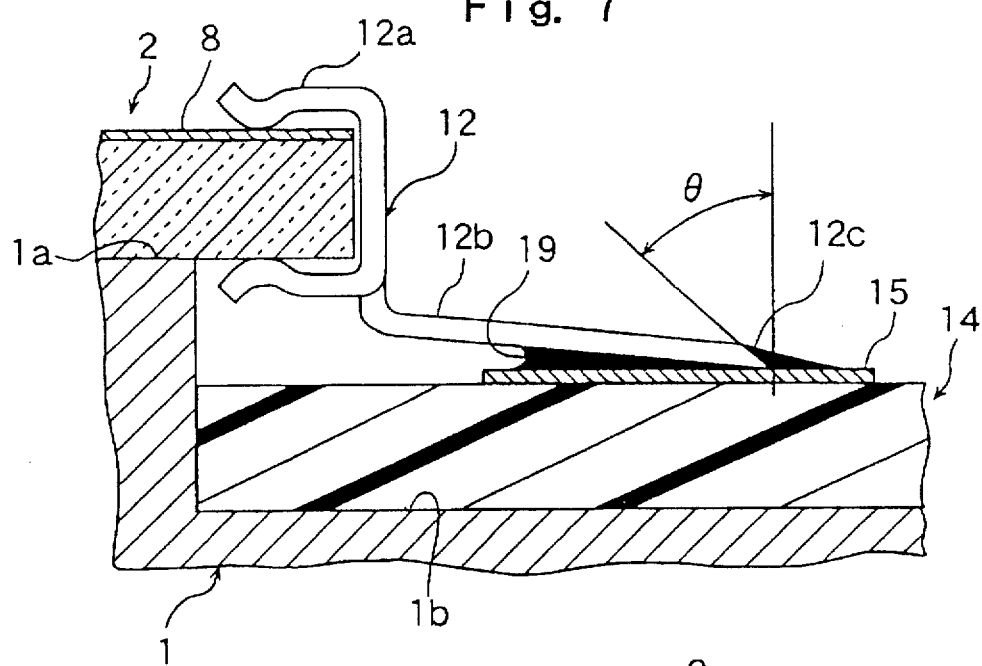
FIG. 7 is an enlarged view of a principal part of FIG. 6.

A plurality of clip-type terminal leads 12 are press-fitted at the projecting longitudinal edge of the head substrate 2 for electrical connection to the respective connection terminals 8. As shown in FIG. 7, each of the terminal leads 12, which is formed by punching a metal plate, has a clip portion 12a for clipping engagement with the head substrate 2 and a stem portion 12b extending obliquely from the clip portion 12a toward the second supporting surface 1b of the heat sink plate 1.

On the other hand, the printed circuit board 14 on the second supporting surface 1b of the heat sink plate 1, which has an elongated rectangular configuration, is made of an insulating material such as a synthetic resin. The printed circuit board 14 has an upper surface formed with, adjacent the both shorter edges thereof, connection electrodes 15 corresponding to the connection terminals 8 on the head substrate 2. The upper surface of the printed circuit board 14 is also formed with a wiring pattern (not shown) for electrically connecting the connection electrodes 15 to a connector 16 for external connection which is provided at a generally central portion of the printed circuit board 12. To the connector 16 is electrically connected, for instance, a flexible cable (not shown) extending from a control unit (not shown).

As shown in FIG. 8, the printed circuit board 12 is attached generally at a longitudinally central portion of a length of L2 (which substantially corresponds to the attached portion L1 of the head substrate 2) to the second supporting surface 1b of the heat sink plate 1 by an adhesive 17 (an ultraviolet-setting adhesive for example). As shown in FIGS. 2–7, in this attached state, the printed circuit board 12 extends into under the head substrate 2.

In the illustrated first embodiment, one of the longitudinal edges of the printed circuit board 12 is located at the boundary between the first supporting surface 1a and second supporting surface 1b of the heat sink plate 1. As a result, an overlapping amount of the printed circuit board 14 and the head substrate 2 is equal to the projecting amount E of the projecting longitudinal edge of the head substrate 2. Since the thickness T of the printed circuit board 14 is smaller than the difference H in height between the first supporting surface 1a and second supporting surface 1b of the heat sink plate 1, there is provided a clearance 18 between the printed circuit board 14 and the head substrate 2.

Figure 6:
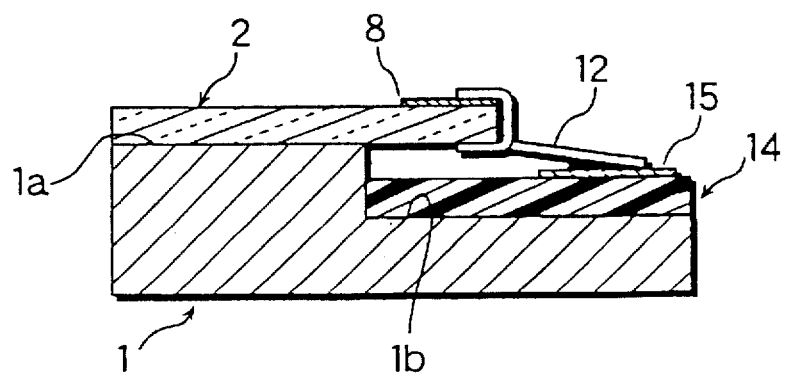
FIG. 6 is a sectional view taken along lines VI—VI of FIG. 1.

As already described, the stem portion 12b of each terminal lead 12 extends obliquely downward toward the second supporting surface 1b of the heat sink plate 2 (see FIGS. 6 and 7). As a result, the stem portion 12b of the terminal lead 12 comes into contact with a corresponding connection electrode 15 on the printed circuit board 14. In this state, the terminal lead 12 is connected to the corresponding terminal electrode 15 by a solder 19. In the first embodiment, the tip of the stem portion 12b of the terminal lead is formed with a tapered surface inclining at a predetermined angle θ relative to a vertical line perpendicular to the upper surface of the printed circuit board 14.

The thermal printhead having the above-described structure has the following advantages.

Firstly, the head substrate 2 and the printed circuit board 14 overlap onto each other widthwise by a predetermined amount E.

Therefore, correspondingly to the overlapping amount E, the thermal printhead including the heat sink plate 1 can be reduced in size, thereby promoting miniaturization.

In the second place, since the clearance 18 in communication with the atmosphere is provided between the head substrate 2 and the printed circuit board 14, the exposed area of the head substrate 2 to the atmosphere and the exposed area of the heat sink plate 1 to the atmosphere can be made larger than if the printed circuit board 14 comes into direct contact with the head substrate 2 from below. As a result, heat-dissipating performance from the head substrate 2 can be improved to a great extent, thereby preventing the electronic elements (the drive ICs 4 in particular) from suffering damages due to overheating of the head substrate 2. Further, the presence of the clearance 8 can surely prevent a thicknesswise thermal expansion of the printed circuit board 14 from affecting the head substrate 2, thereby reducing the possibility of printing irregularities even for high-speed printing, which generates totally a larger amount of heat.

Figure 5:
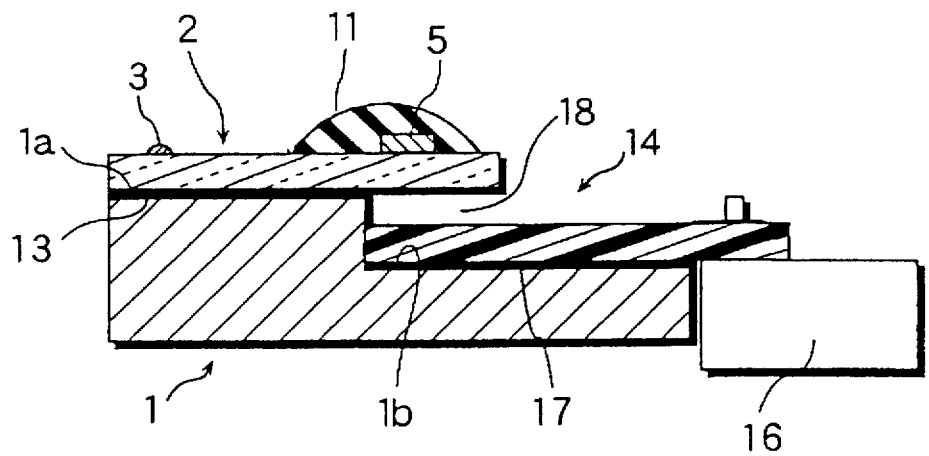
FIG. 5 is a sectional view taken along lines V—V of FIG. 1.

In the third place, one of the longitudinal edges of the head substrate 2 projects from the first supporting surface 1a of the heat sink plate 1, and the thermistor 5 is mounted on the projecting edge of the head substrate 2 (see FIGS. 1 and 5). The projecting edge of the head substrate 2 releases less heat than the portion held in direct contact with the heat sink plate 1 (though more heat than if in direct contact with the printed circuit board 12). Therefore, by mounting the temperature sensing thermistor 5 on the projecting portion of the head substrate 2, response and accuracy to a rise in temperature can be surely improved than if the thermistor 5 is mounted on the head substrate 2 at a portion thereof which comes into direct contact with the heat sink plate 1.

In the fourth place, the connection terminals 8 on the head substrate 2 are electrically connected to the connection electrodes 15 on the printed circuit board 14 via the clip-type terminal leads 12. Thus, since there is no need to wire-bond the head substrate 2 to the printed circuit board 14, possible errors accompanying wire-bondings do not occur. Further, since the stem portion 12b of the terminal lead 12 is elastic, the deflection of the stem portion 12b of the terminal lead 12 can absorb the difference in longitudinal thermal expansion between the head substrate 2 and the printed circuit board 12. Since the printed circuit board 1a made of synthetic resin has a larger coefficient of thermal expansion than the head substrate 2 made of ceramic, the printed circuit board 12 longitudinally expands more than the head substrate 2 due to the heat generated during printing operation. Therefore, if there is no absorption of the difference in expansion by the deflection of the stem portion 12b of the terminal lead 12, both ends of the head substrate 2 are slightly raised above the heat sink plate 1, thereby reducing the amount of heat released to the heat sink plate 1.

In the fifth place, by utilizing the presence of the clearance between the head substrate 2 and the printed circuit board 12, the stem portion 12b of each terminal lead 12 is arranged to extend obliquely downward toward the second supporting surface 1b of the heat sink plate 1 for coming into contact with a corresponding connection electrode 15 on the printed circuit board 12. As a result, as shown in FIG. 7, since melted solder 19 flows into the gap between the stem portion 12b and the connection electrode 15 at the time of soldering, a sufficient soldering strength can be surely obtained. In the first embodiment, the soldering strength can be further increased by causing a tip surface 12c of the terminal lead 12 to incline by a suitable angle θ to enlarge the area in contact with the solder 19.

FIGS. 9–12 show a method of assembling the thermal printhead according to the first embodiment.

Figure 9:
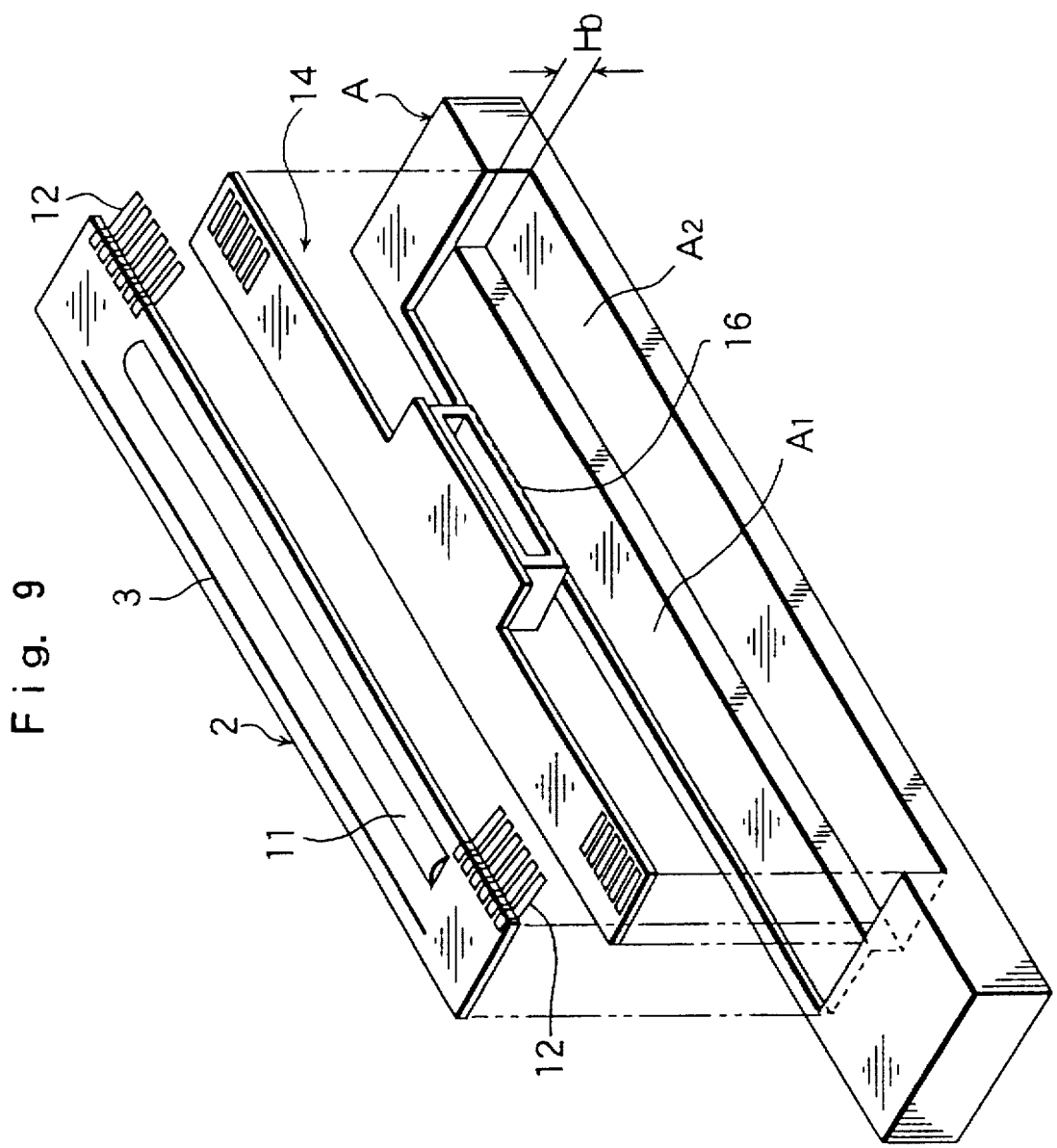
FIG. 9 is a perspective view illustrating a jig used for assembling the thermal printhead shown in FIG. 1 together with the head substrate and the printed circuit board.

Firstly, as shown in FIG. 9, an assemble jig A is prepared. The jig A has a first positioning portion A1 for setting the head substrate 2 at a higher position and a second positioning portion A2 for setting the printed circuit board 14 at a lower position. The difference H0 in height between the first positioning portion A1 and the second positioning portion A2 is set to be slightly smaller than the difference H in height between the first and second supporting surfaces 1a, 1b of the heat sink plate 1 .

Figure 10:
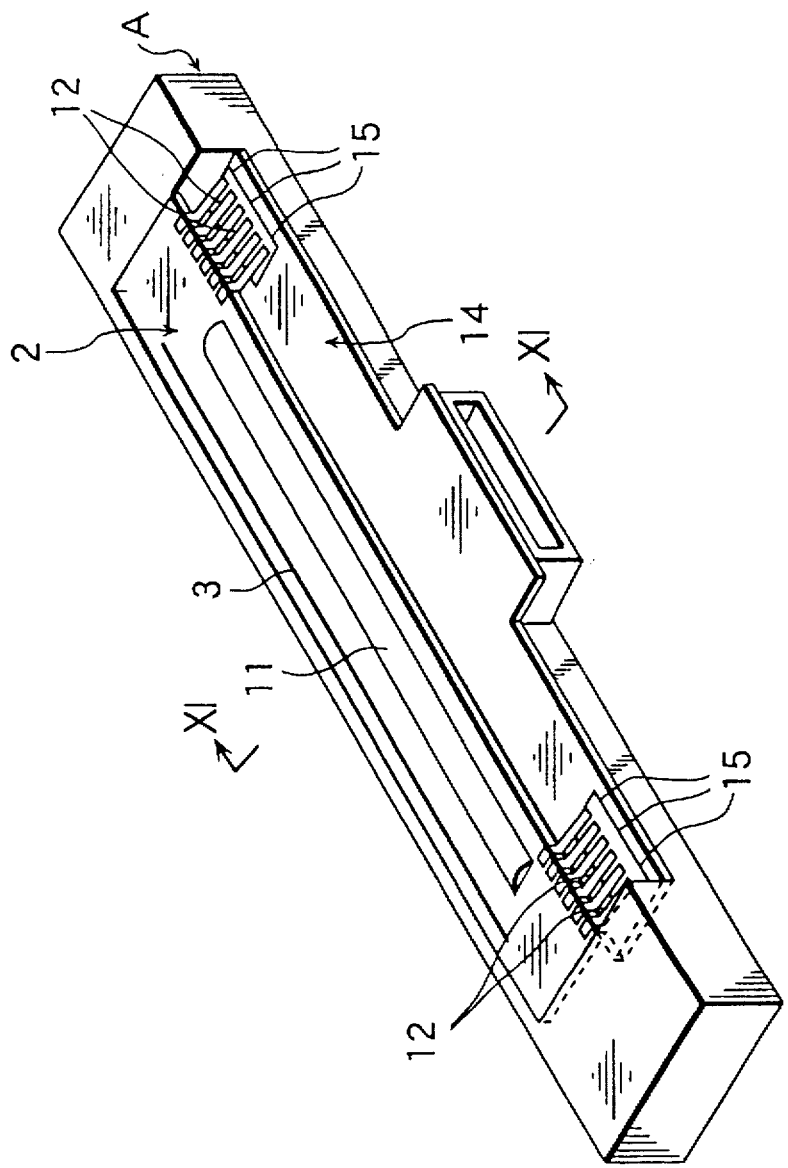
FIG. 10 is a perspective view illustrating the assembled state of the head substrate and printed circuit board by using the jig shown in FIG. 9.
Figure 11:
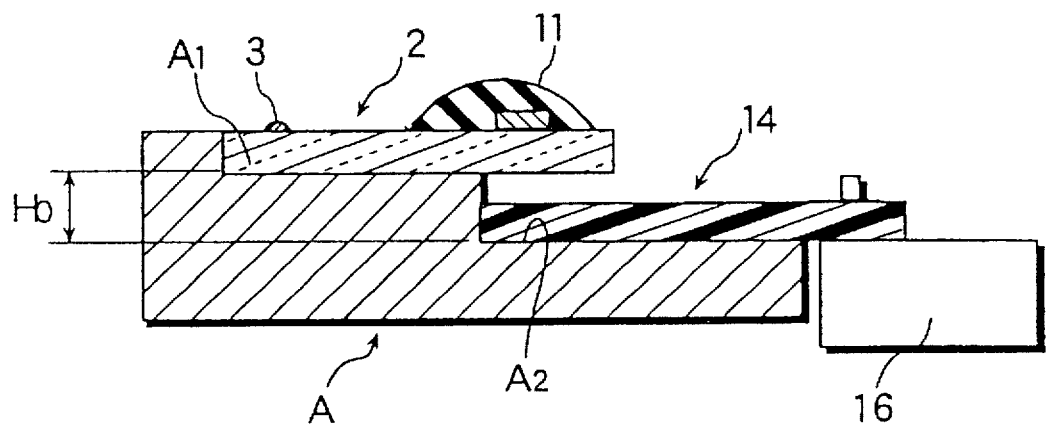
FIG. 11 is a sectional view taken along lines XI—XI of FIG. 10.

Then, as shown in FIGS. 10 and 11, the head substrate 2 is mounted on the first positioning portion A1 of the jig A, whereas the printed circuit board 14 is mounted on the second positioning portion A2. As a result, the head substrate 2 and the printed circuit board 12 are automatically set in positionally proper relation to each other, longitudinally and widthwise.

Next, as also shown in FIGS. 10 and 11, the terminal leads 12 secured adjacent the both ends of the head substrate 2 are soldered to the respective connection electrodes 15 on the printed circuit board 14 (see FIGS. 6 and 7). At this stage, the stem portion 12b of each terminal lead 12 on the head substrate 2 is substantially in an original state.

Figure 12:
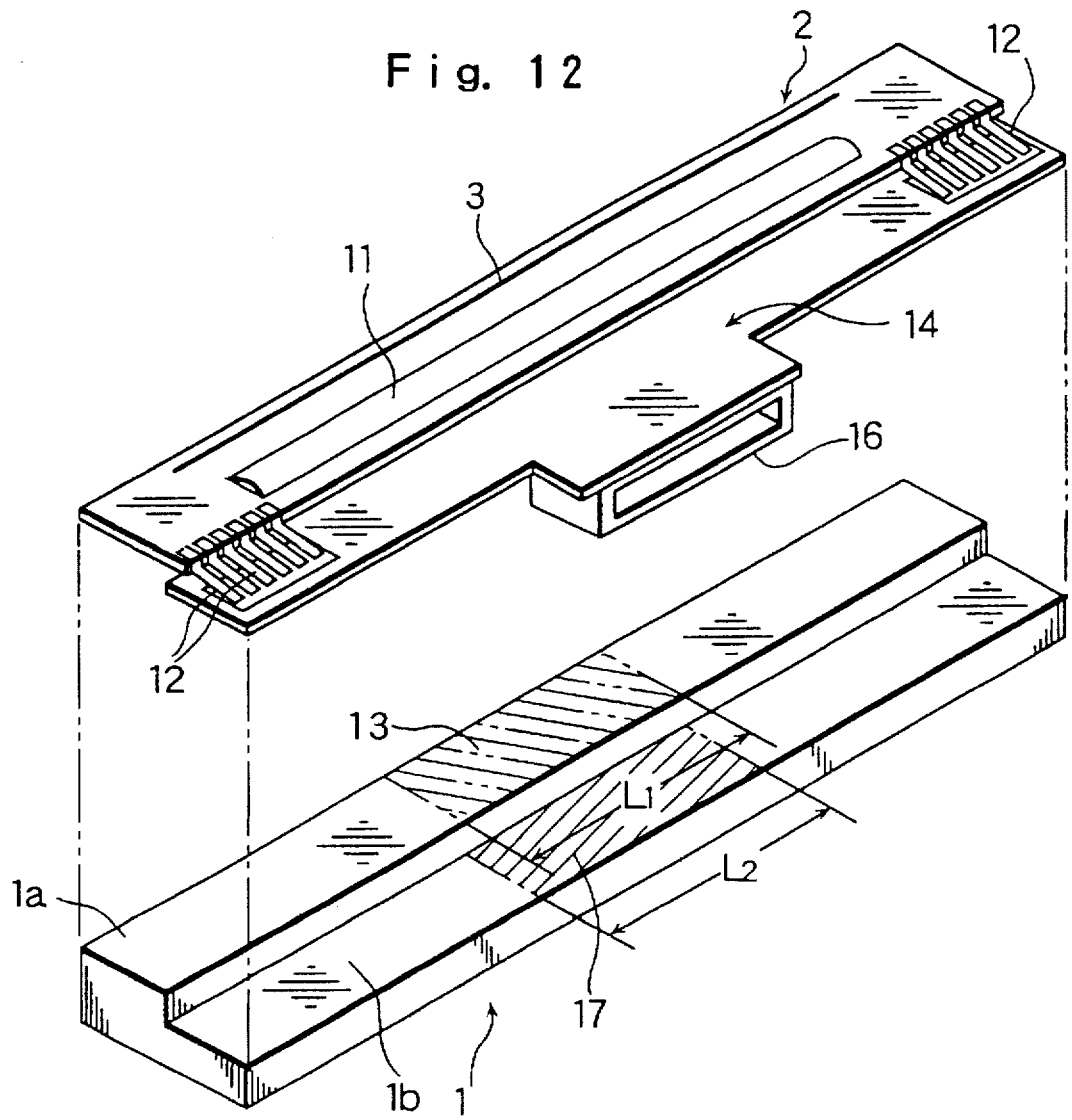
FIG. 12 is a perspective view illustrating the head substrate and the printed circuit board connected to each other to be mounted on a heat sink plate.
Figure 13:
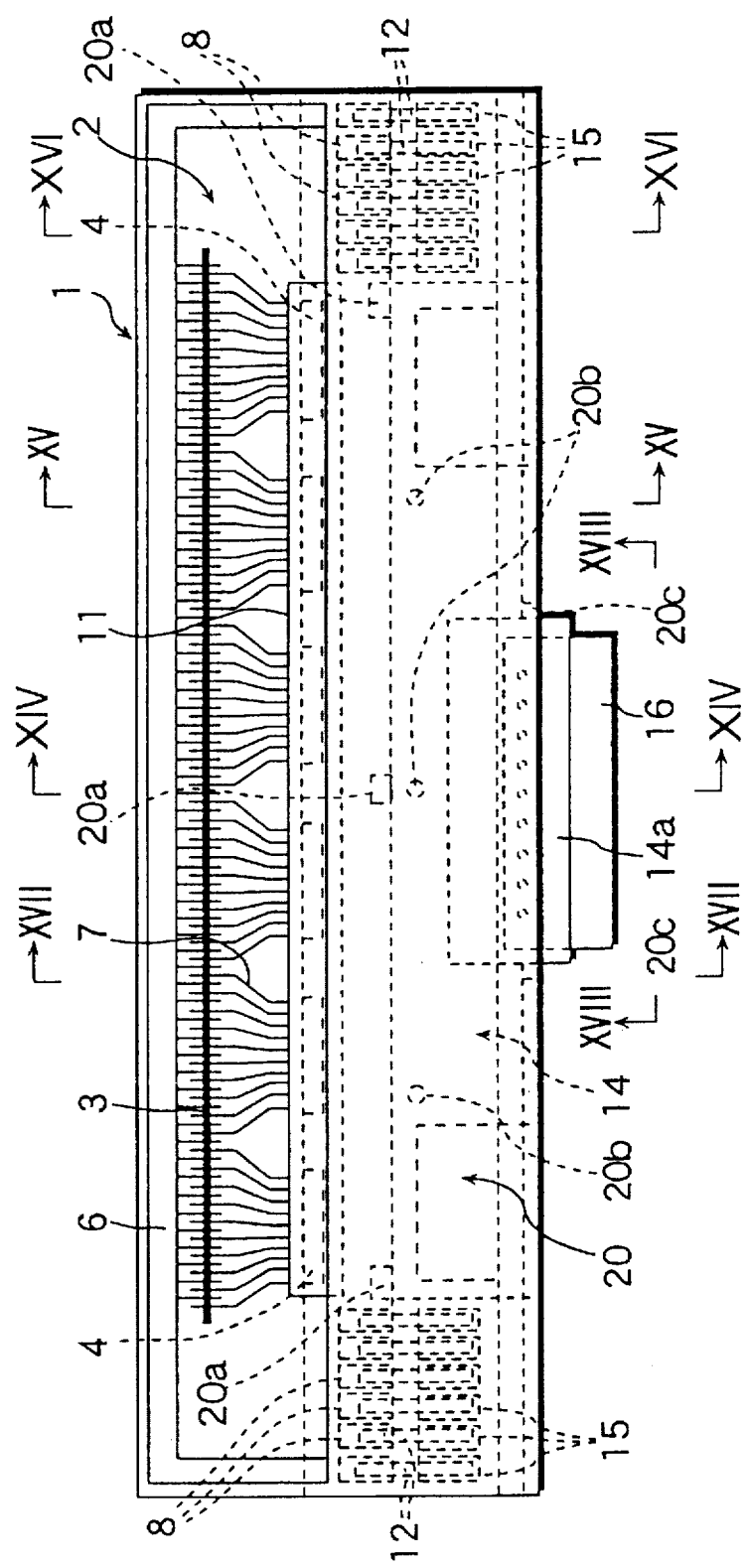
FIG. 13 is a plan view of a thermal printhead according to a second embodiment of the present invention.

Then, thus connected head substrate 2 and printed circuit board 1b are taken out from the jig A, and thereafter they are attached onto the heat sink plate 1, as shown in FIG. 12. For this attachment, the head substrate 2 is attached generally at the longitudinally central portion L1 to the first supporting surface 1a of the heat sink plate 1 by the adhesive 13, whereas the printed circuit board 14 is attached generally at the longitudinally central portion L2 to the second supporting surface 1b of the heat sink plate 1 by the adhesive 17. As already described, since the difference H0 in height between the first positioning portion A1 and second positioning portion A2 of the jig A is slightly smaller than the difference H in height between the first and second supporting surfaces 1a, 1b of the heat sink plate 1, the printed circuit board 14 is deformed in a manner such that the both ends thereof are slightly raised above the second supporting surface 1b of the heat sink plate 1, or in a downwardly convex manner as a whole.

According to the assembling method described above, the printed circuit board 14 is deformed in a downwardly convex manner so that the elastically resuming force of the printed circuit board 14 acts on the both ends of the head substrate 2 via each of the terminal leads 12. As a result, the both ends of the head substrate 2 are constantly pressed to the heat sink plate 1, thereby surely preventing the both ends of the head substrate 2 from slightly rising from the heat sink plate 1. Thus, it is possible to constantly maintain a proper contact state of thermal conductivity between the head substrate 2 and the heat sink plate 1, thereby preventing the printing performance of the thermal printhead from deteriorating with the rise of temperature.

FIGS. 13–22 show a thermal printhead according to a second embodiment of the present invention. The thermal printhead of the second embodiment is basically similar to the thermal printhead of the first embodiment (see FIGS. 1–12). Therefore, constituting elements common to the both embodiments are designated by the same reference numerals and a detailed description is not given.

In addition to the constituting elements already described in reference to the first embodiment, the thermal printhead according to the second embodiment also includes an elongated cover member 20 for covering substantially the whole of the printed circuit board 14 and the projecting longitudinal edge of the head substrate 2. The cover member 20 is made of an electrostatically conductive material having a volume resistivity of $10^5$–$10^9$ ($\Omega$.cm), and has an antistatic property. Such an electrostatically conductive material can be made by mixing a synthetic resin such as epoxy resin with a suitable amount of conductive powder such as carbon powder.

Figure 18:
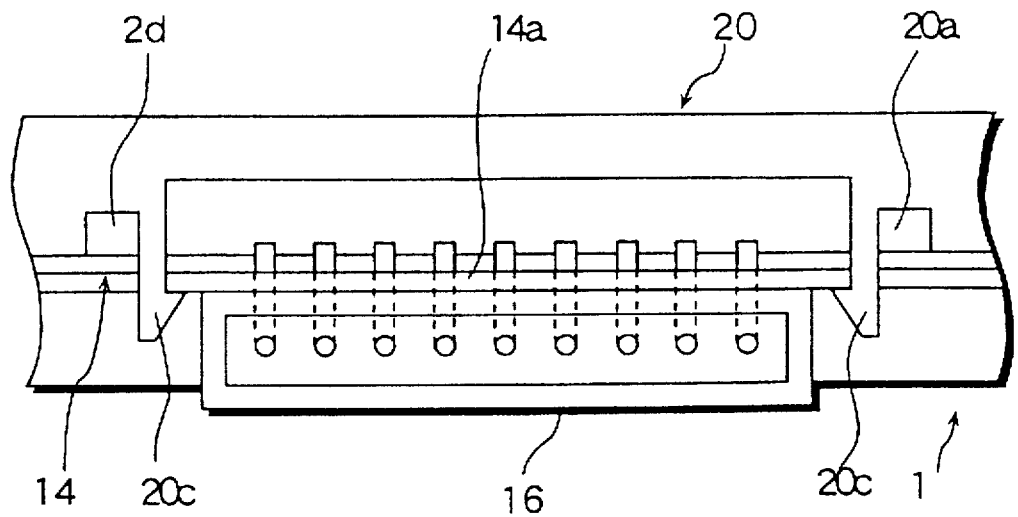
FIG. 18 is a view taken in the direction of the arrows along lines XVIII—XVIII of FIG.13.
Figure 19:
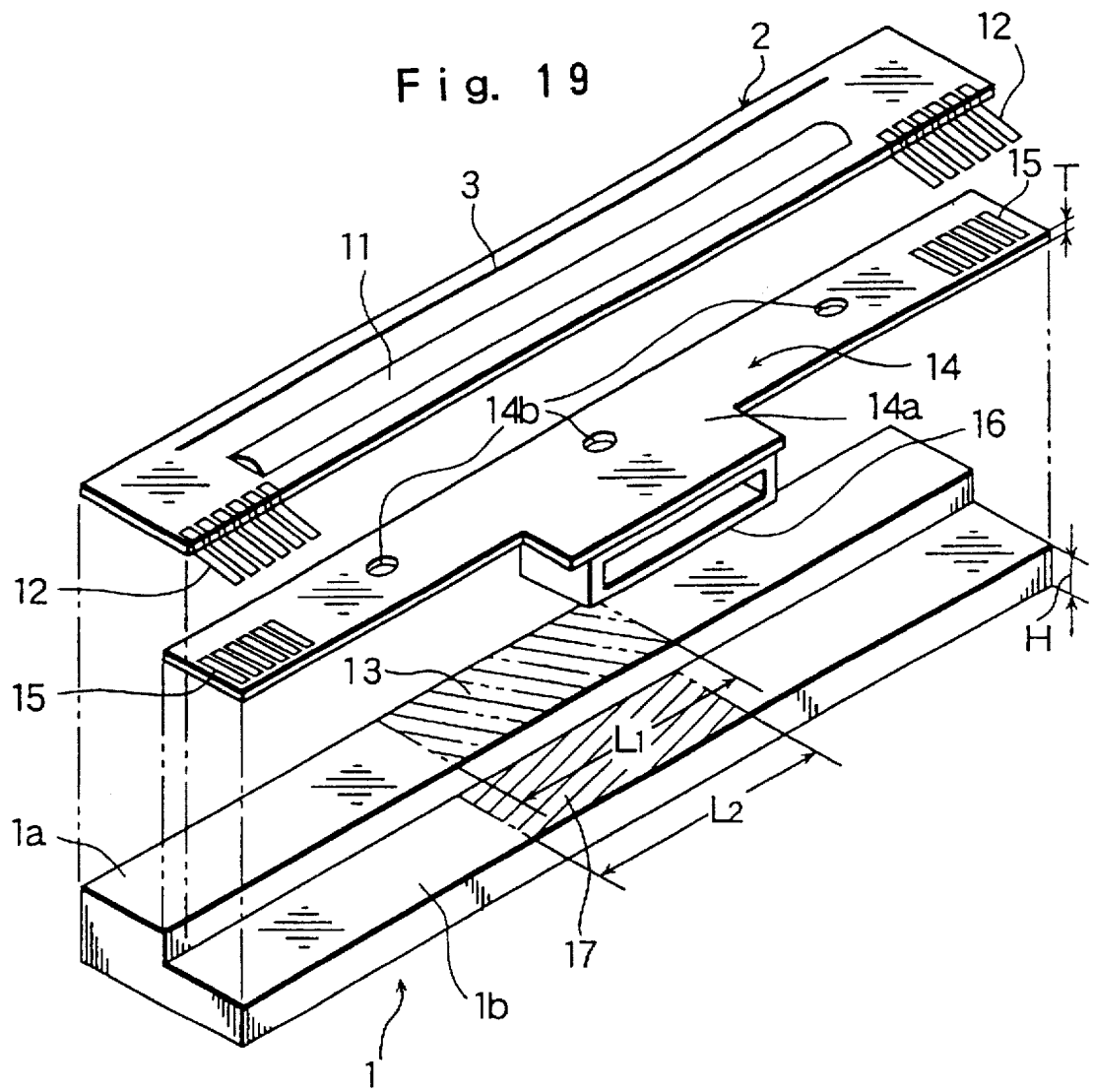
FIG. 19 is an exploded perspective view of the thermal printhead show in FIG. 13.
Figure 20:
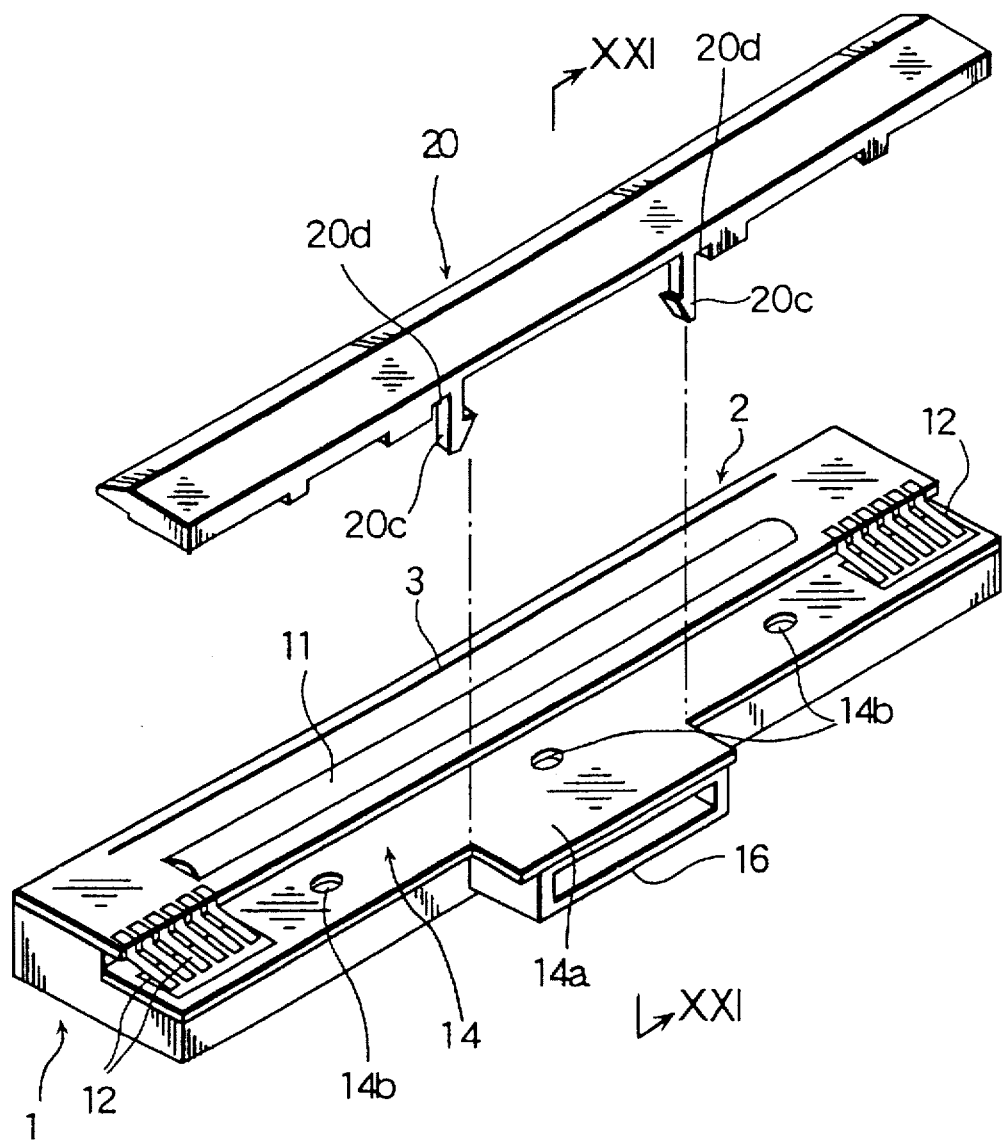
FIG. 20 is a perspective view illustrating a state wherein a cover member is just about to be mounted on the thermal printhead shown in FIG. 13.
Figure 21:
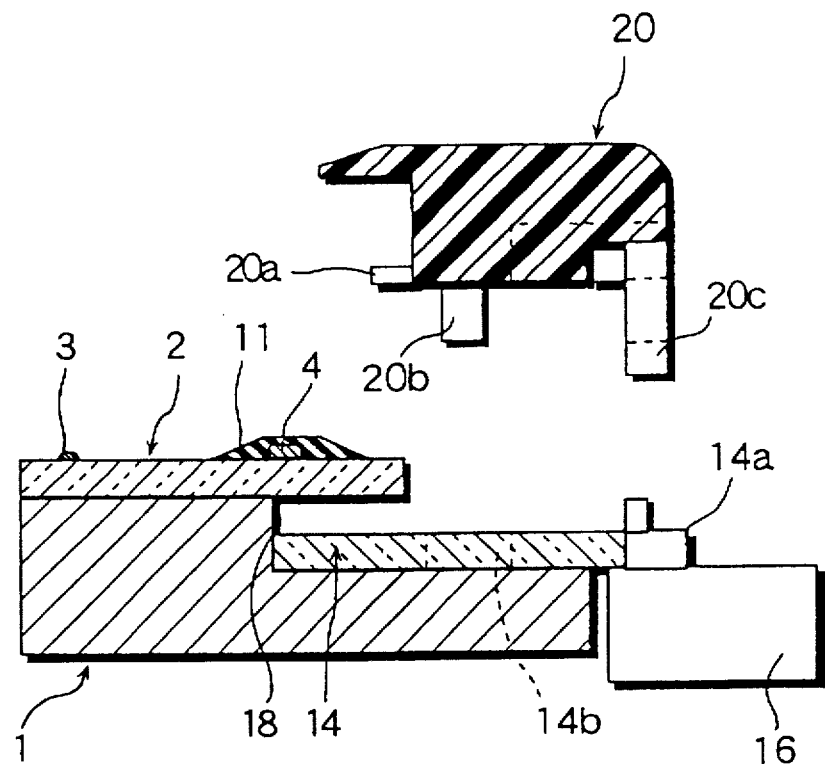
FIG. 21 is a sectional view taken along lines XXI—XXI of FIG. 20.

One longitudinal edge of the cover member 20 is integrally formed with a plurality of engagement tongues 20a. The lower surface of the cover member 20 is integrally formed with a plurality of abutment legs 20b adjacent to the above-mentioned one longitudinal edge. The other longitudinal edge of the lower surface of the cover member 20 is integrally formed with a pair of elastic engagement legs 20c with a longitudinal predetermined spacing therebetween. To increase the elasticity of the engagement legs 20c, a groove 20d may be formed on the longitudinal outside of each engagement leg 20c, as shown in FIGS. 18 and 20.

Figure 14:
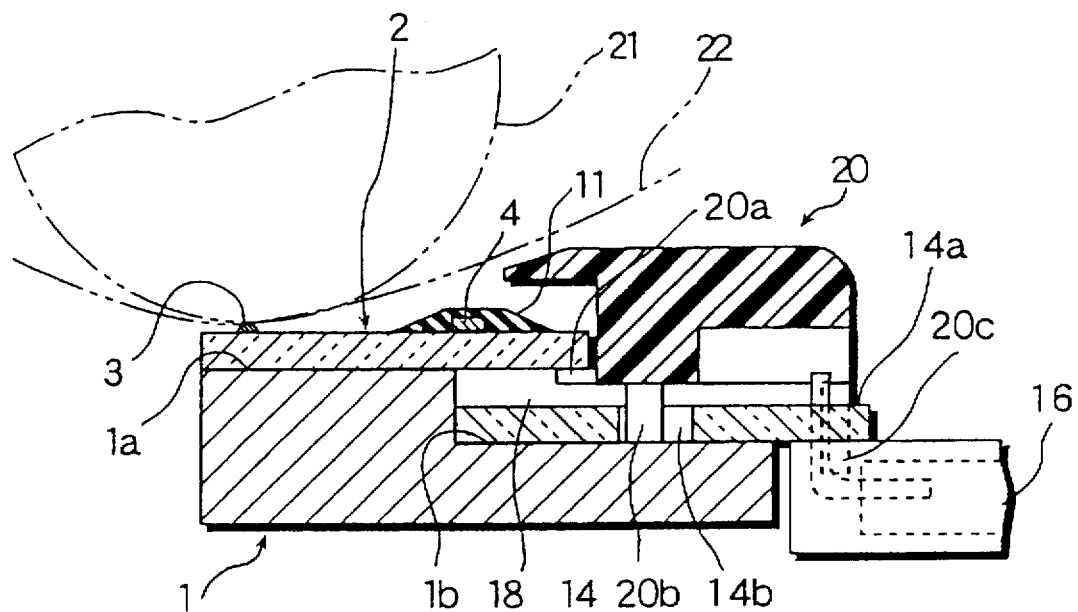
FIG. 14 is a sectional view taken along lines XIV—XIV of FIG. 13.
Figure 15:
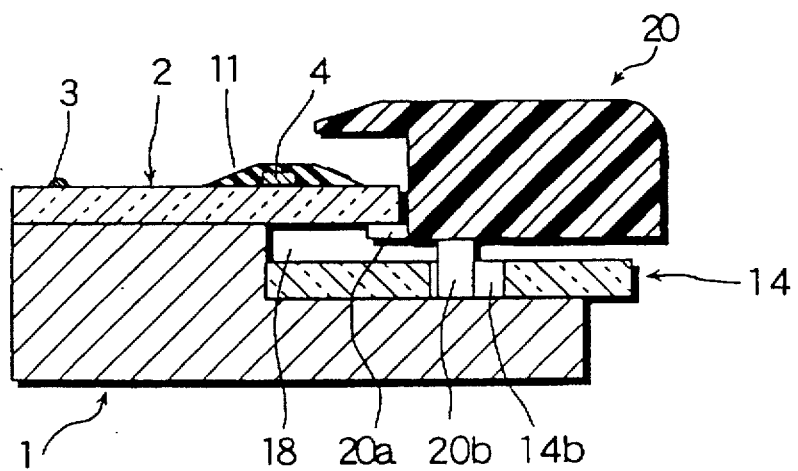
FIG. 15 is a sectional view taken along lines XV—XV of FIG. 13.
Figure 16:
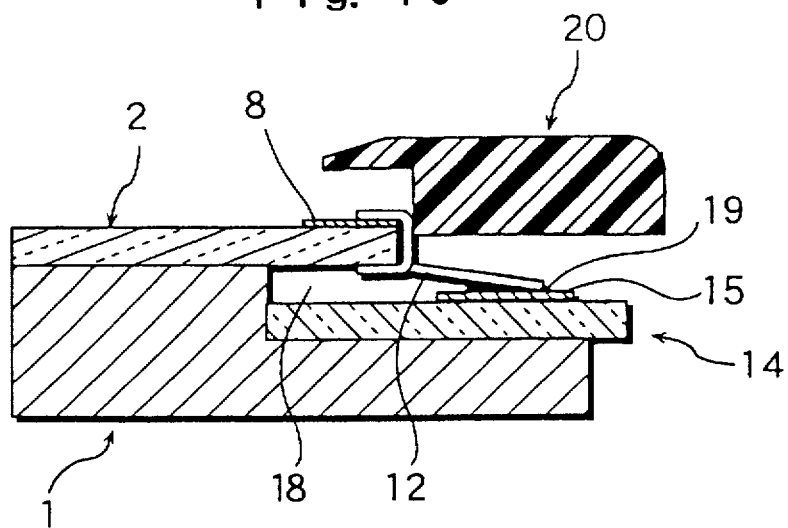
FIG. 16 is a sectional view taken along lines XVI—XVI of FIG. 13.
Figure 17:
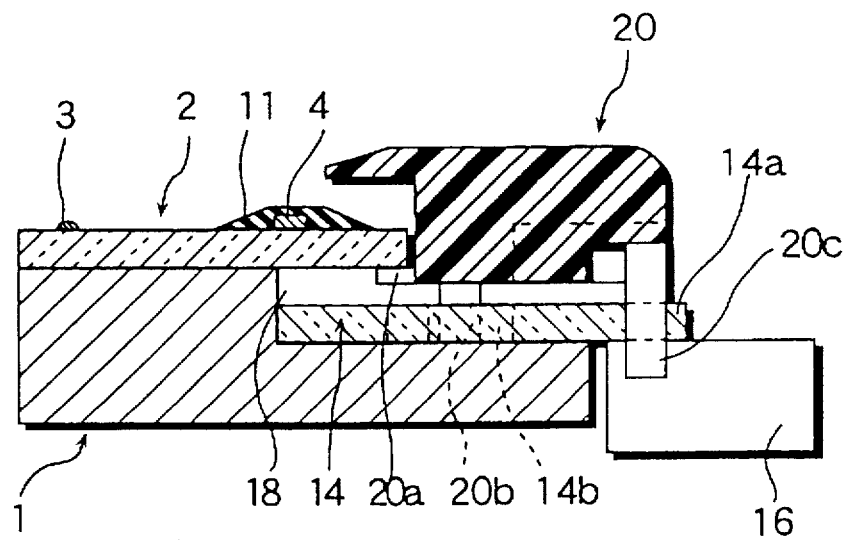
FIG. 17 is a sectional view taken along lines XVII—XVII of FIG. 13.

As shown in FIGS. 14 and 15, each engagement tongue 20a of the cover member 20 comes into engagement with the projecting longitudinal edge of the head substrate 2 from below (that is, from the side of the clearance 18). The printed circuit board 14 is formed with a plurality of through holes 14b corresponding to the abutment legs 20b of the cover member 20 (see FIGS. 14, 15, 19 and 20). In the assembled state of the cover member 20, the abutment legs 20b are held in direct contact with the second supporting surface 1b of the heat sink plate 1 via the through holes 14b of the printed circuit board 14. The printed circuit board 14 also includes a central projecting portion 14a which projects from the second supporting surface 1b of the heat sink plate 1. Both of the engagement legs 20c of the cover member 20 elastically engage the central projecting portion 14a (see FIGS. 13, 14, 17, 18 and 20).

Figure 22:
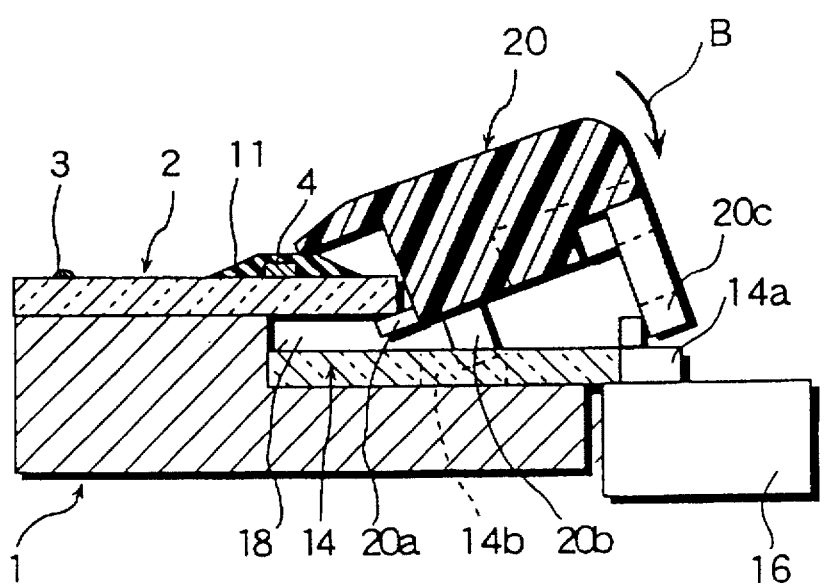
FIG. 22 is a sectional view similar to FIG. 21, illustrating a state wherein the cover member is being mounted on the thermal printhead show FIG. 13.

In the foregoing second embodiment, the abutment legs 20b of the cover member 20 are closer to the engagement tongues 20a rather than to the engagement legs 20c. With such an arrangement, as shown in FIG. 22, the cover member 20 can be easily and surely secured to the printed circuit board 14 and heat sink plate 1 by utilizing the principles of the lever and fulcrum, that is, in a manner such that firstly the engagement tongues 20a are held in engagement with the projecting longitudinal edge of the head substrate 2 with the cover member 20 slightly inclined, and then the cover member 20 is simply pushed down in the direction of an arrow B.

In printing operation of the thermal printhead according to the second embodiment, as shown in FIG. 14, a printing medium 22 (thermosensitive paper for example) supported by a platen 21 is guided by the cover member 20. As already described, the cover member 20 is capable of conducting static electricity. Therefore, whenever static electricity is generated upon supplying a printing medium 22, it is conducted to the metallic heat sink plate 1 via the abutment legs 20b of the cover member 20. As a result, the drive ICs 4 and others can be prevented from suffering damages due to the static electricity. Since the cover member 20 simply engages the head substrate 2 only by the engagement tongues 20a, the longitudinal thermal expansion of the cover member 20 hardly affects the head substrate 2.

In the illustrated second embodiment, the engagement legs 20c of the cover member 20 are arranged to elastically engage (in snapping engagement with) the central projecting portion 14a of the printed circuit board 14. However, when the entirety of the above-mentioned one longitudinal edge of the printed circuit board 14 slightly projects from the second supporting surface 1b of the heat sink plate 1, the engagement legs 20c of the cover member 20 may be arranged to engage such a projecting longitudinal edge of the printed circuit board 14.

Alternatively, when both ends of the printed circuit board 14 slightly project from the respective ends of the heat sink plate 1, the cover member 20 may be formed with engagement legs for engaging the projecting ends of the printed circuit board 14 in addition to the engagement legs 20c for engaging the central projecting portion 14a (or the projecting longitudinal edge) of the printed circuit board 14. In this case, the engagement tongues 20a for the head substrate 2 may not be needed.

In each of the foregoing first embodiment and second embodiment, the plurality of terminal leads 12 (the connection terminals 8 and the connection electrodes 15) are separately arranged at the both ends of the head substrate 2 and printed circuit board 14. However, alternatively, the terminal leads 12 may be arranged together generally at a longitudinally central portion of the head substrate 2 and printed circuit board 14.

Figure 23:
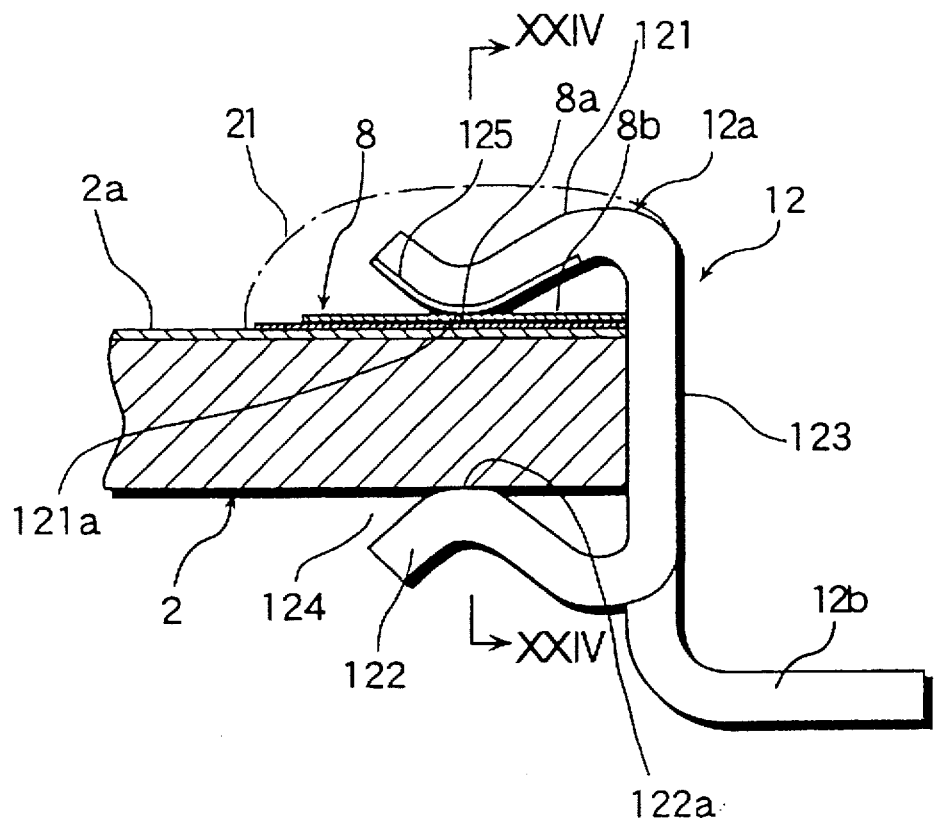
FIG. 23 is a side view showing an example of the structure of a clip-type terminal lead used for the thermal printhead shown in FIG. 1 or 13.
Figure 24:
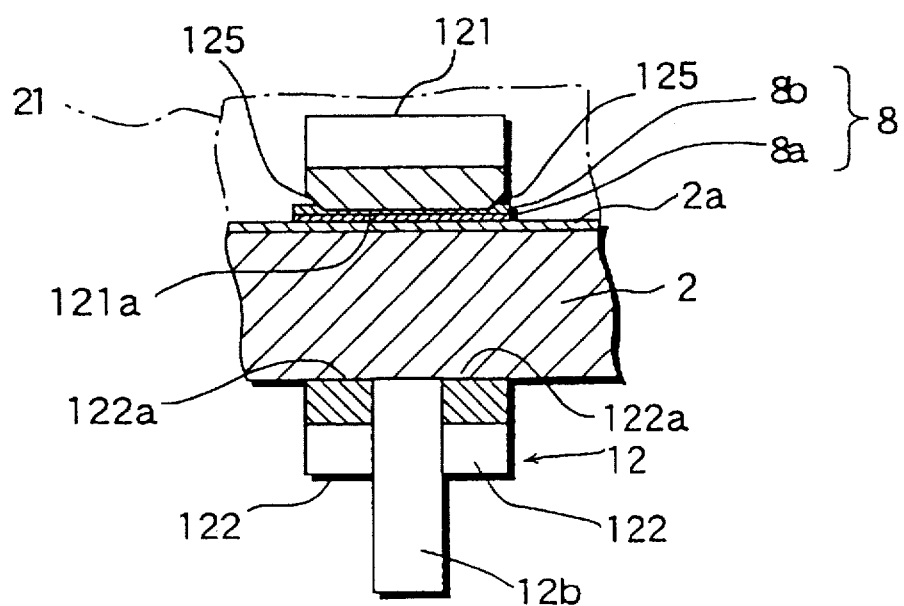
FIG. 24 is a sectional view taken along lines XXIV—XXIV of FIG. 23.
Figure 25:
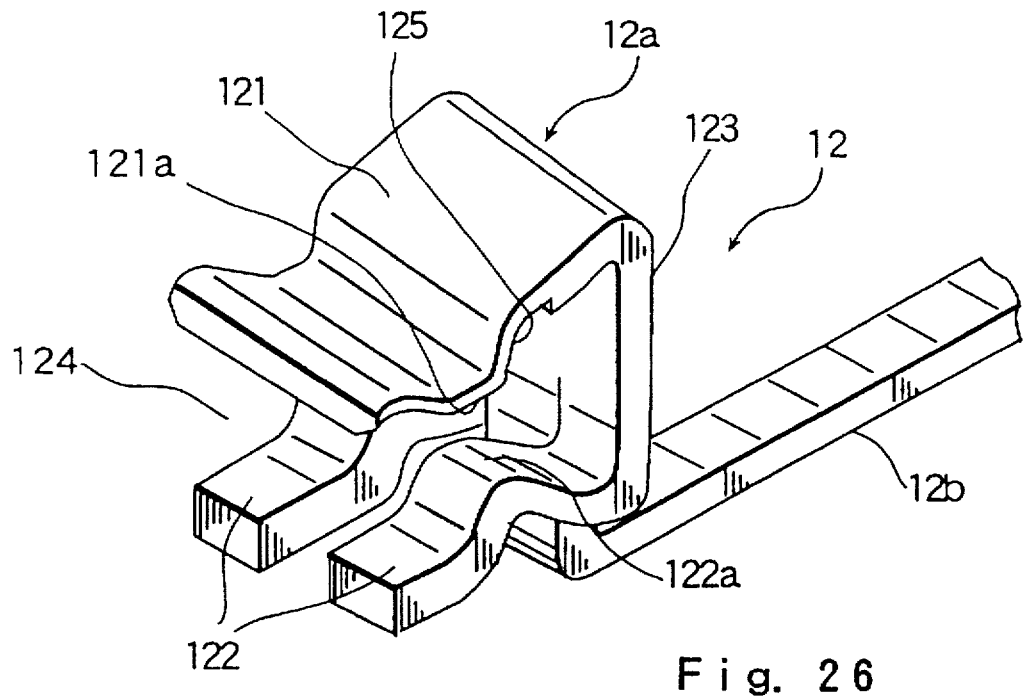
FIG. 25 is a perspective view of the clip-type terminal lead shown in FIG. 23.

FIGS. 23–25 illustrate a preferred structure of each terminal lead 12 as well as a preferred structure of each connection terminal 8 on the head substrate 2.

Specifically, as shown in FIGS. 23 and 22, the upper surface of the head substrate 2 is formed with a glaze layer 2a upon which each connection terminal 8 is formed (in FIGS. 1–22, the glaze layer 2a is not shown for convenience of illustration). Preferably, the connection terminal 8 is formed to have a multi-layer structure (2-layer structure in the illustrated embodiment), including a gold layer 8a made by printing and sintering an organic gold paste and a silver layer 8b by printing and sintering a silver paste applied on the upper surface of the gold layer 8a.

Such a multi-layer structure is provided for causing the connection terminal 8 as a whole to have a large thickness by piling up the silver layer 8b. The gold layer 8a is formed by a single application of gold due to a problem of the cost, and therefore, the resulting thickness is very small, that is, about 0.7 μm. If the connection terminal 8 includes only the gold layer 8a, the thin gold layer 8a is scraped due to the friction caused when the the clip portion 12a of the terminal lead 12 is press-fitted, thereby bringing the clip portion 12a into direct contact with the glaze layer 2a of the head substrate 2, possibly resulting in incurring an improper state of electrical conduction with the connection terminal 8. However, when it is possible in terms of the cost to increase the thickness of the gold layer 8a, the silver layer 8b may be dispensed with.

The piling up of the silver layer 8b also has the following advantage. Specifically, the terminal lead 12 is produced by punching a metal plate of phosphor bronze into a suitable shape, subjecting the shaped metal to a bending process and, finally, plating it with solder or nickel to improve contact conduction property to the connection terminal 8. If the terminal lead 12 is solder-plated and comes into direct contact with the gold layer 8a, the solder melts due to the heat generated during the operation of the thermal printhead and is absorbed by the gold layer, thereby making it impossible to maintain a proper contact conduction between the terminal lead 12 and the connection terminal 8. Such a phenomenon is known as so-called "solder eating". The silver layer 8b piled up on the gold layer 8a serves to prevent or reduce the "solder eating".

As already described, the terminal lead 12 has a clip portion 12a for engaging a longitudinal edge of the head substrate 2 and a stem portion 12b projecting from the clip portion 12a. More specifically, as the best shown in FIG. 25, the clip portion 12a of the terminal lead 12 includes a first engagement piece 121 for contacting with the connection terminal 8, a pair of second engagement pieces 122 for engaging the lower surface of the head substrate 2 and a connecting portion 123 for connecting the engagement pieces 121, 122 to one another. A clip opening 124 is present between the first engagement piece 121 and the second engagement pieces 122. The width of the clip opening 124 between the tip of the engagement piece 121 and the tips of the engagement pieces 122 is set to be larger than the thickness of the head substrate 2 including the glaze layer 2a, thereby facilitating the press-fitting of the clip portion 12a to the head substrate 2.

The first engagement piece 121 includes in an intermediate part a convex contact portion 121a projecting toward the second engagement pieces 122. Similarly, each of the second engagement pieces 122 includes a convex contact portion 122a projecting toward the first engagement piece 121. In the original state of the clip portion 12a, the width of the clip opening 124 between the first engagement 121 and the second engagement pieces 122 is set, at the positions of the convex contact portions 121a, 122a, to be smaller than the thickness of the head substrate 2 including the glaze layer 2a. Thus, when the terminal lead 12 is mounted on the head substrate 2, the elastic resuming force of the engagement pieces 121, 122 permit the clip portion 12a to hold onto the head substrate 2. Further, since each of the convex contact portions 121a, 122a has a smooth structure, the mounting of the clip portion 12a onto the head substrate 2 can be performed smoothly.

Further, both of the side edges of the first engagement piece 121 of the clip portion 12a are formed with chamfers 125 facing the connection terminal 8. Each chamfer 125 extends continuously from the tip of the first engagement piece 121 at least to a point beyond the convex contact portion 121a. Each chamfer 125 may be an inclined surface as shown in FIG. 24 or a curved surface. The dimension of the chamfer 125 when viewed thicknesswise of the first engagement piece 121 is preferably no less than 0.05 mm for example. Such a dimension setting is not influenced by the thickness of the first engagement piece 121 (0.25 mm in the illustrated embodiment). Though the chamfers 125 may be formed by partially filing down the respective side edges of the first engagement pieces 121, it may be also formed by plastically deforming the same side edges in the direction away from the second engagement pieces 122.

Figure 28:
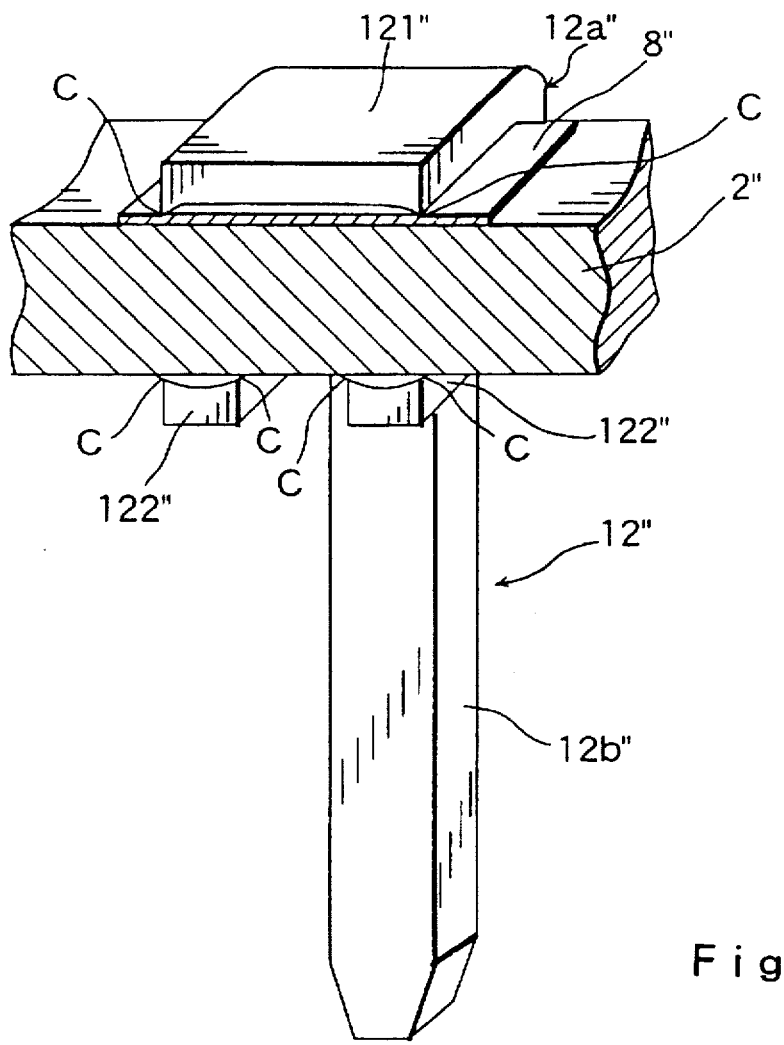
FIG. 28 is a perspective view illustrating a state wherein a prior art clip-type terminal lead is used.

To describe the technical significance of the chamfer 125, firstly problems of a prior art clip-type terminal lead will be described with reference to FIG. 28. In FIG. 28, to indicate corresponding constituting elements, (") is added to the same reference numerals as used in FIGS. 23–25, and no overlapping description is repeated.

Since the prior art clip-type terminal lead 12" shown in FIG. 28 is formed by punching a metal plate and then subjecting this to a bending process, burrs C are inevitably formed at the edges of the first engagement piece 121" and second engagement pieces 122". Thus, when the clip portion 12a " of the terminal lead is press-fitted onto the head substrate 2", the connection terminal 8" is rendered to line-contact with the burrs C of the first engagement piece 121", whereas the other portions tend to slightly rise from the connection terminal 8". Such a rising tendency may become outstanding especially when the burrs C are large in dimensions or when the thickness of the connection terminal 8" is small. Further, when the burrs C are irregularly formed, the contact condition between the first engagement piece 121" and the connection terminal 8" becomes worse. If the first engagement piece 121" and the connection terminal 8" are electrically connected by separate soldering, the inferior contact condition therebetween is hardly a problem. In such a case, however, a sufficient spacing (more than 1.5 mm for example) should be provided between the connection terminals for preventing the adjacent connection terminals from being short-circuited, thereby making it impossible to dispose a large number of connection terminals in a region of limited dimensions.

On the contrary, when both of the side edges of the first engagement piece 121 are provided with chamfers 125 as shown in FIGS. 23–25, the first engagement piece 121 partially scrapes the silver layer 8b of the connection terminal 8 between the both chamfers 125, thereby establishing a surface contact. In addition, the chamfers 125 partially contact with the connection terminal 8 due to the scraping into the silver layer 8b. Therefore, without performing separate soldering, the clip portion 12a of the terminal lead 12 and the connection terminal 8 can be held in a proper contact condition (electrically conductive condition) to each other.

In the arrangement shown in FIGS. 23–25, a connection portion between the first engagement piece 121 of the clip portion 12a and the connection terminal 8 is enclosed by a transparent insulating resin 21. The insulating resin 21 serves to reinforce the connection between the clip portion 12a and the connection terminal 8, while preventing the drive ICs from breaking down due to the passage of the static electricity, which is generated during printing operation of the thermal printhead, through the connection terminals 8.

Figure 26:
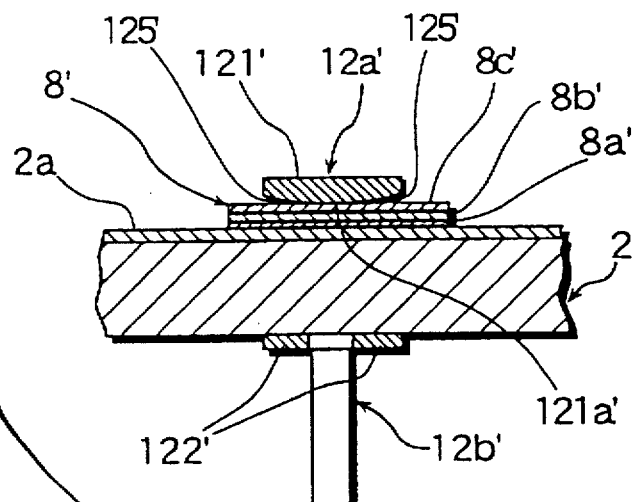
FIG. 26 is a sectional front view illustrating another example of the structure of a clip-type terminal lead used for the thermal printhead shown in FIG. 1 or 13.
Figure 27:
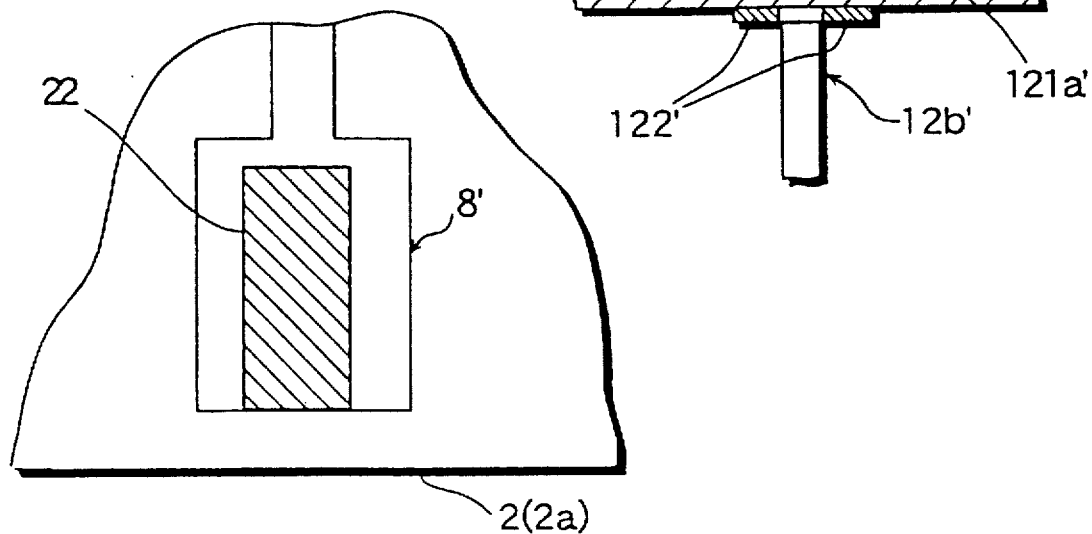
FIG. 27 is a plan view showing a contact region in a connection terminal when the terminal lead shown in FIG. 26 is used.

FIGS. 26 and 27 illustrate another preferred structure of the terminal lead together with another preferred structure of each connection terminal on the head substrate 2.

Specifically, the connection terminal 8' shown in FIG. 26 has a multi-layer structure (3-layer structure in the illustrated embodiment), including a gold layer 8a', a silver layer 8b' formed on the upper surface of the gold layer 8a' and a silver-palladium (Ag—Pd) layer 8c' formed on the upper surface of the silver layer 8b'. The silver-palladium layer 8c' is provided for more certain prevention of the "solder eating" when the terminal lead 12' is solder-plated. However, as already described, even the silver layer 8b' alone can prevent the "solder eating" to some extent.

As shown in FIG. 26, the terminal lead 12' has a clip portion 12a' engaging a longitudinal edge of the head substrate 2 and a stem portion 12b' projecting from the clip portion 12a'. The clip portion 12a' has a first engagement piece 121' in contact with the connection terminal 8', a pair of second engagement pieces 122' engaging the lower surface of the head substrate 2 and a connection portion (not shown) for connecting the engagement pieces 121', 122' to one another. The first engagement piece 121' has a contact portion 121a'for the connection terminal 8' wherein the contact portion as a whole is convexly curved in transverse section thereof. As a result, both side edges 125' of the first engagement piece 121' are offset away from the connection terminal 8'.

Figure 29:
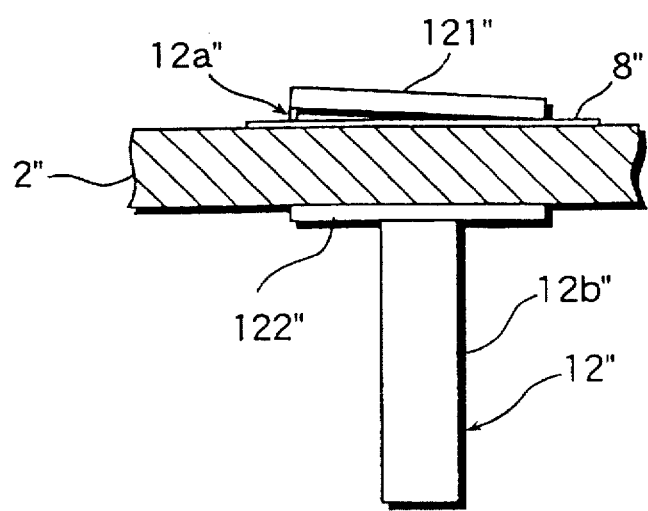
FIG. 29 is a front view illustrating another state wherein the prior art clip-type terminal lead shown in FIG. 28 is used.

To describe advantages of the above structure, firstly, problems in a prior art clip-type terminal lead are described. In FIG. 29, to show corresponding constituting elements, the same reference numerals as in FIG. 28 each having (") are used together with ("), and no overlapping description is repeated.

In the prior art clip-type terminal lead 12" shown in FIG. 29, due to manufacturing errors, the first engagement piece 121" is not formed in parallel to the second engagement pieces 122" when viewed transversely. When the first engagement piece 121" is thus inclined, only one of the side edges is held in contact with the connection terminal 8", thereby failing to realize a proper electrical contact between the clip portion 12a" and the connection terminal 8". This problem becomes outstanding especially when burrs (the elements C in FIG. 28) are formed on the clip portion 12a".

On the other hand, according to the structure shown in FIG. 26, the contact portion 121a' of the first engagement piece 121' as a whole has a convexly curved section when viewed transversely.

Therefore, even when the first engagement piece 121' is transversely inclined relative to the second engagement pieces 122', the first engagement piece is similarly held in contact with the connection terminal 8' and scrapes the connection terminal 8' (the exposed silver-palladium layer 8c') in a region 22 of a generally constant width as shown in FIG. 27 when the clip portion 12a' is press-fitted onto the head substrate 2'. As a result, a proper electrical connection can be obtained between the clip portion 12a' and the connection terminal 8', thereby dispensing with separate soldering.

The preferred embodiments of the present invention being thus described, the scope of the present invention is not limited to these embodiments. For instance, the drive ICs 4 may be mounted on the printed circuit board 1a instead of on the head substrate 2. Therefore, it should be appreciated that the present invention may be modified in many ways within the scope of the following claims, and also that equivalents are included within the scope of the right.

We claim:

1. A thermal printhead comprising:

a stepped heat sink plate having an upper first supporting surface and a lower second supporting surface;

a head substrate mounted on the first supporting surface of the heat sink plate and formed with printing dots; and a printed circuit board mounted on the second supporting surface of the heat sink plate and formed with a wiring pattern;

wherein the head substrate has an edge projecting from the first supporting surface of the heat sink plate toward the second supporting surface; and wherein the printed circuit board overlaps the projecting edge of the head substrate with a predetermined spacing therebetween; and wherein the head substrate is provided with a plurality of drive ICs for driving the printing dots, the projecting edge of the head substrate being formed with a plurality of connecting terminals electrically connected to the drive ICs, the printed circuit board being formed with a plurality of connection electrodes corresponding to the connection terminals on the head substrate, each of the connection terminals on the head substrate being electrically connected to a corresponding connection electrode on the printed circuit board via a clip-type terminal lead, the terminal lead having a clip portion which is held in clipping engagement with the projecting edge of the head substrate and a stem portion which extends from the clip portion toward the printed circuit board.

2. The thermal printhead according to claim 1, wherein the stem portion of the terminal lead extends obliquely toward the printed circuit board for soldering to the corresponding connection electrode.

3. The thermal printhead according to claim 1, wherein the stem portion of the terminal lead has a tip surface which inclines at an obtuse angle relative to the printed circuit board.

4. The thermal printhead according to claim 1, wherein the clip portion of the terminal lead has an engagement piece held in contact with the corresponding connection terminal on the head substrate, both side edges of the engagement piece being offset away from the connection terminal.

5. The thermal printhead according to claim 4, wherein both of the side edges of the engagement piece of the terminal lead are chamfered.

6. The thermal printhead according to claim 4, wherein the engagement piece of the terminal lead has a contact portion for the corresponding connection terminal, the contact portion as a whole being convexly curved in transverse section toward the corresponding connection terminal.

7. The thermal printhead according to claim 4, wherein the engagement piece of the clip portion of the terminal lead together with the corresponding connection terminal on the head substrate is enclosed by an insulating resin.

8. The thermal printhead according to claim 1, wherein each connection terminal on the head substrate has a multi-layer structure.

9. The thermal printhead according to claim 8, wherein each connection terminal of the head substrate includes a lower layer made of gold and a surface layer made of one selected from silver and silver-palladium.

10. A thermal printhead comprising:

a stepped heat sink plate having an upper first supporting surface and a lower second supporting surface;

a head substrate mounted on the first supporting surface of the heat sink plate and formed with printing dots; and a printed circuit board mounted on the second supporting surface of the heat sink plate and formed with a wiring pattern;

wherein the head substrate has an edge projecting from the first supporting surface of the heat sink plate toward the second supporting surface;

wherein the printed circuit board overlaps the projecting edge of the head substrate with a predetermined spacing therebetween; and wherein the head substrate is attached generally at a longitudinally central portion thereof to the first supporting surface of the first supporting surface of the heat sink plate, the printed circuit board being attached generally at a longitudinally central portion thereof to the second supporting surface of the heat sink plate, both ends of the head substrate being connected to both ends of the printed circuit board, respectively, via a plurality of clip-type terminal leads, the printed circuit board being deformed so that its both ends are closer to the head substrate.

11. A thermal printhead comprising:

a stepped heat sink plate having an upper first supporting surface and a lower second supporting surface;

a head substrate mounted on the first supporting surface of the heat sink plate and formed with printing dots; and a printed circuit board mounted on the second supporting surface of the heat sink plate and formed with a wiring pattern;

wherein the head substrate has an edge projecting from the first supporting surface of the heat sink plate toward the second supporting surface;

wherein the printed circuit board overlaps the projecting edge of the head substrate with a predetermined spacing therebetween;

wherein the printed circuit board is covered with a cover member projecting toward the head substrate, the cover member comprising a plurality of engagement legs which are held in snapping engagement with predetermined portions of the printed circuit board and at least one abutment leg which rests on the heat sink plate; and wherein the cover member further comprises at least one engagement tongue which engages the projecting edge of the head substrate.

12. The thermal printhead according to claim 11, wherein said at least one abutment leg of the cover member is disposed between each engagement leg and said at least one engagement tongue as well as at a position closer to the engagement tongue when viewed widthwise of the cover member.

13. The thermal printhead according to claim 11, wherein the cover member is made of an electrostatically conductive resin.

* * * * *